(12) United States Patent
Goektepe et al.

(10) Patent No.: US 10,965,401 B2
(45) Date of Patent: Mar. 30, 2021

(54) RECEIVER, TRANSMITTER, COMMUNICATION NETWORK, DATA SIGNAL AND METHOD IMPROVING A RETRANSMISSION PROCESS IN A COMMUNICATION NETWORK

(71) Applicant: FRAUNHOFER-GESELLSCHAFT ZUR FOERDERUNG DER ANGEWANDTEN FORSCHUNG E.V., Munich (DE)

(72) Inventors: Baris Goektepe, Berlin (DE); Thomas Fehrenbach, Berlin (DE); Cornelius Hellge, Berlin (DE); Thomas Schierl, Berlin (DE); Yago Sanchez De La Fuente, Berlin (DE); Thomas Wiegand, Berlin (DE)

(73) Assignee: FRAUNHOFER-GESELLSCHAFT ZUR FOERDERUNG DER ANGEWANDTEN FORSCHUNG E.V., Munich (DE)

(*) Notice: Subject to any disclaimer, the term of this patent is extended or adjusted under 35 U.S.C. 154(b) by 0 days.

(21) Appl. No.: 16/419,332

(22) Filed: May 22, 2019

(65) Prior Publication Data
US 2019/0273574 A1      Sep. 5, 2019

Related U.S. Application Data

(63) Continuation of application No. PCT/EP2017/079424, filed on Nov. 16, 2017.

(30) Foreign Application Priority Data

Nov. 23, 2016   (EP) .................................... 16200361

(51) Int. Cl.
*H04L 1/00*   (2006.01)
*H03M 13/11*   (2006.01)
(Continued)

(52) U.S. Cl.
CPC ......... *H04L 1/007* (2013.01); *H03M 13/1102* (2013.01); *H04L 1/00* (2013.01);
(Continued)

(58) Field of Classification Search
CPC ......... H04L 1/007; H04L 1/00; H04L 1/1819; H04L 1/08; H04L 1/0045; H04L 1/0041; H03M 13/1102; H04W 84/042
See application file for complete search history.

(56) References Cited

U.S. PATENT DOCUMENTS

2007/0162815 A1   7/2007   El-Khamy et al.
2007/0260957 A1   11/2007   Soljanin et al.
(Continued)

FOREIGN PATENT DOCUMENTS

KR     101299124 B1    8/2013
RU     2015103856 A    8/2016
(Continued)

OTHER PUBLICATIONS

RUPTO, Official Action with English translation, dated Jan. 17, 2020 re Russian Patent Application No. 201911938208(037475).
(Continued)

*Primary Examiner* — Thien Nguyen
(74) *Attorney, Agent, or Firm* — Perry + Currier

(57) ABSTRACT

Data to be transmitted over a channel from a transmitter to a receiver is encoded to obtain a codeword. The codeword is defined by a plurality of variable nodes associated with a plurality of the check nodes of a bipartite graph representing the code. The codeword is transmitted over the channel such that certain variable nodes are transmitted prior to other variable nodes. The certain variable nodes are associated with a subset of the check nodes of the bipartite graph and define a subcodeword known at the receiver. At the receiver, a decodability of the transmitted codeword is estimated
(Continued)

using the subcodeword prior to receiving all variable nodes of the codeword.

31 Claims, 11 Drawing Sheets

(51) Int. Cl.
    *H04L 1/08*     (2006.01)
    *H04L 1/18*     (2006.01)
    *H04W 84/04*     (2009.01)

(52) U.S. Cl.
    CPC .......... *H04L 1/0041* (2013.01); *H04L 1/0045* (2013.01); *H04L 1/08* (2013.01); *H04L 1/1819* (2013.01); *H04W 84/042* (2013.01)

(56) References Cited

U.S. PATENT DOCUMENTS

| | | | |
|---|---|---|---|
| 2010/0023834 | A1 | 1/2010 | Richardson et al. |
| 2011/0138260 | A1 | 6/2011 | Savin |
| 2012/0290892 | A1 | 11/2012 | Pisek |
| 2013/0223485 | A1 | 8/2013 | Bai et al. |
| 2013/0262961 | A1* | 10/2013 | Richardson ........... H03M 13/13 714/776 |
| 2018/0357530 | A1* | 12/2018 | Beery .................. G06N 3/0454 |

FOREIGN PATENT DOCUMENTS

| | | |
|---|---|---|
| WO | WO-2007082191 A2 | 7/2007 |
| WO | WO-2014199865 A1 | 12/2014 |

OTHER PUBLICATIONS

ETSI, "LTE; Evolved Universal Terrestrial Radio Access (E-UTRA); Physical channels and modulation." 3GPP TS 36.211 version 13.1.0 Release 13, Apr. 2016.

Costello, D. J., "Spatial Coupling vs. Block Coding: A Comparison", Berkeley, Feb. 2015, https://simons.berkeley.edu/sites/default/files/docs/2808/slidescostelloshort.pdf.

Johnson, Sarah J. "Introducing low-density parity-check codes." University of Newcastle, Australia (2006): V1. http://sigpromu.org/sarah/SJohnsonLDPCintro.pdf.

Kienle, Frank, and Norbert Wehn. "Low complexity stopping criterion for LDPC code decoders." 2005 IEEE 61st Vehicular Technology Conference. vol. 1. IEEE, 2005.

Nokia, Alcatel-Lucent Shanghai Bell, "Performance of mMTC and URLLC channel coding candidates", R1-167271, 3GPP TSG-RAN WG1 #86, Gothenburg, Sweden, Aug. 22-26, 2016.

Nokia, Alcatel-Lucent Shanghai Bell, "Early Hybrid ARG Feedback for the 5 G New Radio", 3GPP TSG-RAN WG1 #87, Reno, USA, Nov. 14-18, 2016.

ZTE, ZTE Microelectronics, "Consideration on LDPC design for NR", 3GPP TSG RAN WG1 #87, R1-1611112, Reno, USA Nov. 14-18, 2016.

* cited by examiner $$H = \begin{bmatrix} 1 & 1 & 1 & 1 & 0 & 0 & 0 & 0 & 0 & 0 & 0 & 0 \\ 0 & 0 & 0 & 0 & 1 & 1 & 1 & 1 & 0 & 0 & 0 & 0 \\ 0 & 0 & 0 & 0 & 0 & 0 & 0 & 0 & 1 & 1 & 1 & 1 \\ \hline 1 & 0 & 1 & 0 & 0 & 1 & 0 & 0 & 0 & 1 & 0 & 0 \\ 0 & 1 & 0 & 0 & 0 & 0 & 1 & 1 & 0 & 0 & 0 & 1 \\ 0 & 0 & 0 & 1 & 1 & 0 & 0 & 0 & 1 & 0 & 1 & 0 \\ \hline 1 & 0 & 0 & 1 & 0 & 0 & 1 & 0 & 0 & 1 & 0 & 0 \\ 0 & 1 & 0 & 0 & 0 & 1 & 0 & 1 & 0 & 0 & 1 & 0 \\ 0 & 0 & 1 & 0 & 1 & 0 & 0 & 0 & 1 & 0 & 0 & 1 \end{bmatrix}$$

Fig. 3(a)

RECEIVER, TRANSMITTER, COMMUNICATION NETWORK, DATA SIGNAL AND METHOD IMPROVING A RETRANSMISSION PROCESS IN A COMMUNICATION NETWORK

CROSS-REFERENCE TO RELATED APPLICATIONS

This application is a continuation of copending International Application No. PCT/EP2017/079424, filed Nov. 16, 2017, which is incorporated herein by reference in its entirety, and additionally claims priority from European Application No. EP 16200361.0, filed Nov. 23, 2016, which is also incorporated herein by reference in its entirety.

The present invention concerns the field of wireless or wired communication networks or systems, more specifically, communication networks in which signal transmission is susceptible to noise so that a retransmission of data and/or redundancy is requested. Embodiments of the invention concern an improved retransmission process in a communication network using, e.g., a predictive hybrid automatic repeat request (HARQ) for low-density parity-check (LDPC) codes.

BACKGROUND OF THE INVENTION

FIG. 1 is a schematic representation of an example of a network infrastructure, such as a wireless communication network or wireless communication system, including a plurality of base stations $eNB_1$ to $eNB_5$, each serving a specific area surrounding the base station schematically represented by the respective cells $100_1$ to $100_5$. The base stations are provided to serve users within a cell. A user may be a stationary device or a mobile device. Further, the wireless communication system may be accessed by IoT devices which connect to a base station or to a user. IoT devices may include physical devices, vehicles, buildings and other items having embedded therein electronics, software, sensors, actuators, or the like as well as network connectivity that enable these devices to collect and exchange data across an existing network infrastructure. FIG. 1 shows an exemplary view of only five cells, however, the wireless communication system may include more such cells. FIG. 1 shows two users UE1 and UE2, also referred to as user equipment (UE), that are in cell $100_2$ and that are served by base station $eNB_2$. Another user $UE_3$ is shown in cell $100_4$ which is served by base station $eNB_4$. The arrows $102_1$, $102_2$ and $102_3$ schematically represent uplink/downlink connections for transmitting data from a user $UE_1$, $UE_2$ and $UE_3$ to the base stations $eNB_2$, $eNB_4$ or for transmitting data from the base stations $eNB_2$, $eNB_4$ to the users $UE_1$, $UE_2$, $UE_3$. Further, FIG. 1 shows two IoT devices $104_1$ and $104_2$ in cell $100_4$, which may be stationary or mobile devices. The IoT device $104_1$ accesses the wireless communication system via the base station $eNB_4$ to receive and transmit data as schematically represented by arrow $106_1$. The IoT device $104_2$ accesses the wireless communication system via the user $UE_3$ as is schematically represented by arrow $106_2$.

The wireless communication system may be any single-tone or multicarrier system based on frequency-division multiplexing, like the orthogonal frequency-division multiplexing (OFDM) system, the orthogonal frequency-division multiple access (OFDMA) system, or any other IFFT-based signal with or without CP, e.g. DFT-s-OFDM. Other waveforms, like non-orthogonal waveforms for multiple access, e.g. filter-bank multicarrier (FBMC), generalized frequency division multiplexing (GFDM) or universal filtered multi carrier (UFMC), may be used.

Data may also be communicated over channels of a wired communication network or a combination of wired and wireless networks, for example, a local area network (LAN), a G.hn network operating over different types of wires like telephone wires, coaxial cables and/or power lines, or a wide area network (WAN) such as the internet.

In the above referenced networks data may be overlaid with noise while being transmitted over the channel so that the data may not be processed correctly or may not be processed at all at the receiver. For example, when the data to be transmitted is encoded using a predefined code, a codeword representing the data is generated at the transmitter and forwarded to the receiver over the channel. During the transmission, the codeword may be overlaid with noise to such an extent that decoding of the codeword is not possible, e.g., because of noisy channel situations. To address such a situation, wired and/or wireless communication networks may employ a retransmission mechanism. For example, when the receiver detects that a received codeword cannot be decoded, a retransmission from the transmitter or sender is requested. For example, a HARQ (hybrid automatic repeat request) may be used to request a retransmission from the transmitter to correct decoding failures. For example, additional redundancy may be requested. At the transmitter, encoding the data includes generating redundancy that may include redundant bits that are added to the data to be transmitted. During a first transmission only a part of the redundancy may be transmitted. When a retransmission is requested, further parts of the redundancy may be send to the receiver. For example, HARQ may employ chase combining (every re-transmission contains the same information—data and parity bits), or incremental redundancy (every re-transmission contains different information than the previous one).

The retransmission, however, causes a delay due to the additional round-trip time (RTT) which includes the propagation delays over the network and the processing delays at the UE and the eNB. Thus, in communication networks it is desired to reduce delays caused due to erroneous data transmissions and associated retransmission requests.

SUMMARY

An embodiment may have a receiver, wherein the receiver is configured to receive encoded data over a channel from a transmitter, wherein the data is encoded to obtain a codeword, wherein the codeword is defined by a plurality of variable nodes associated with a plurality of the check nodes of a bipartite graph representing the code, wherein the codeword is transmitted over the channel such that certain variable nodes, which are associated with a subset of the check nodes of the bipartite graph, are transmitted prior to other variable nodes, and wherein the certain variable nodes define a subcodeword known by the receiver; and wherein the receiver is configured to estimate a decodability of the transmitted codeword using the subcodeword prior to receiving all variable nodes of the codeword.

According to another embodiment, a transmitter may have: an encoder configured to encode data to obtain a codeword, wherein the codeword is defined by a plurality of variable nodes associated with a plurality of the check nodes of a bipartite graph representing the code; and a transmit unit configured to transmit the codeword over a channel to a receiver such that certain variable nodes associated with a subset of the check nodes of the bipartite graph are transmitted prior to other variable nodes, wherein the certain variable nodes define a subcodeword known at the receiver and used by the receiver to estimate a decodability of the transmitted codeword prior to receiving all variable nodes of the codeword.

Another embodiment may have a data signal including data to be transmitted over a channel from a transmitter to a receiver, wherein the data is encoded to obtain a codeword, and wherein the codeword is defined by a plurality of variable nodes associated with a plurality of the check nodes of a bipartite graph representing the code, the data signal having: a subcodeword known at the receiver and defined by certain variable nodes associated with a subset of the check nodes of the bipartite graph; and the remaining variable nodes of the codeword, at least some of the variable nodes or all of the variable nodes following the first part.

According to another embodiment, a communication network may have: an inventive receiver, and an inventive transmitter.

According to another embodiment, a method may have the steps of: receiving encoded data over a channel from a transmitter, wherein the data is encoded to obtain a codeword, wherein the codeword is defined by a plurality of variable nodes associated with a plurality of the check nodes of a bipartite graph representing the code, wherein the codeword is transmitted over the channel such that certain variable nodes, which are associated with a subset of the check nodes of the bipartite graph, are transmitted prior to other variable nodes, and wherein the certain variable nodes define a subcodeword known by the receiver; and estimating a decodability of the transmitted codeword using the subcodeword prior to receiving all variable nodes of the codeword.

According to another embodiment, a method may have the steps of: encoding data to obtain a codeword, wherein the codeword is defined by a plurality of variable nodes associated with a plurality of the check nodes of a bipartite graph representing the code; and transmitting the codeword over a channel to a receiver such that certain variable nodes associated with a subset of the check nodes of the bipartite graph are transmitted prior to other variable nodes, wherein the certain variable nodes define a subcodeword known at the receiver and used by the receiver to estimate a decodability of the transmitted codeword prior to receiving all variable nodes of the codeword.

According to another embodiment, a method may have the steps of: encoding data to be transmitted over a channel from a transmitter to a receiver, wherein the data is encoded to obtain a codeword, wherein the codeword is defined by a plurality of variable nodes associated with a plurality of the check nodes of a bipartite graph representing the code; transmitting the codeword over the channel such that the certain variable nodes are transmitted prior to other variable nodes, wherein the certain variable nodes are associated with a subset of the check nodes of the bipartite graph and define a subcodeword known at the receiver; and estimating, at the receiver, a decodability of the transmitted codeword using the subcodeword prior to receiving all variable nodes of the codeword.

Another embodiment may have a non-transitory digital storage medium having a computer program stored thereon to perform the inventive methods when said computer program is run by a computer.

BRIEF DESCRIPTION OF THE DRAWINGS

Embodiments of the present invention will be detailed subsequently referring to the appended drawings, in which.

DETAILED DESCRIPTION OF THE INVENTION

In the following, embodiments of the present invention are described in further detail with reference to the enclosed drawings in which elements having the same or similar function are referenced by the same reference signs.

Figure 1:
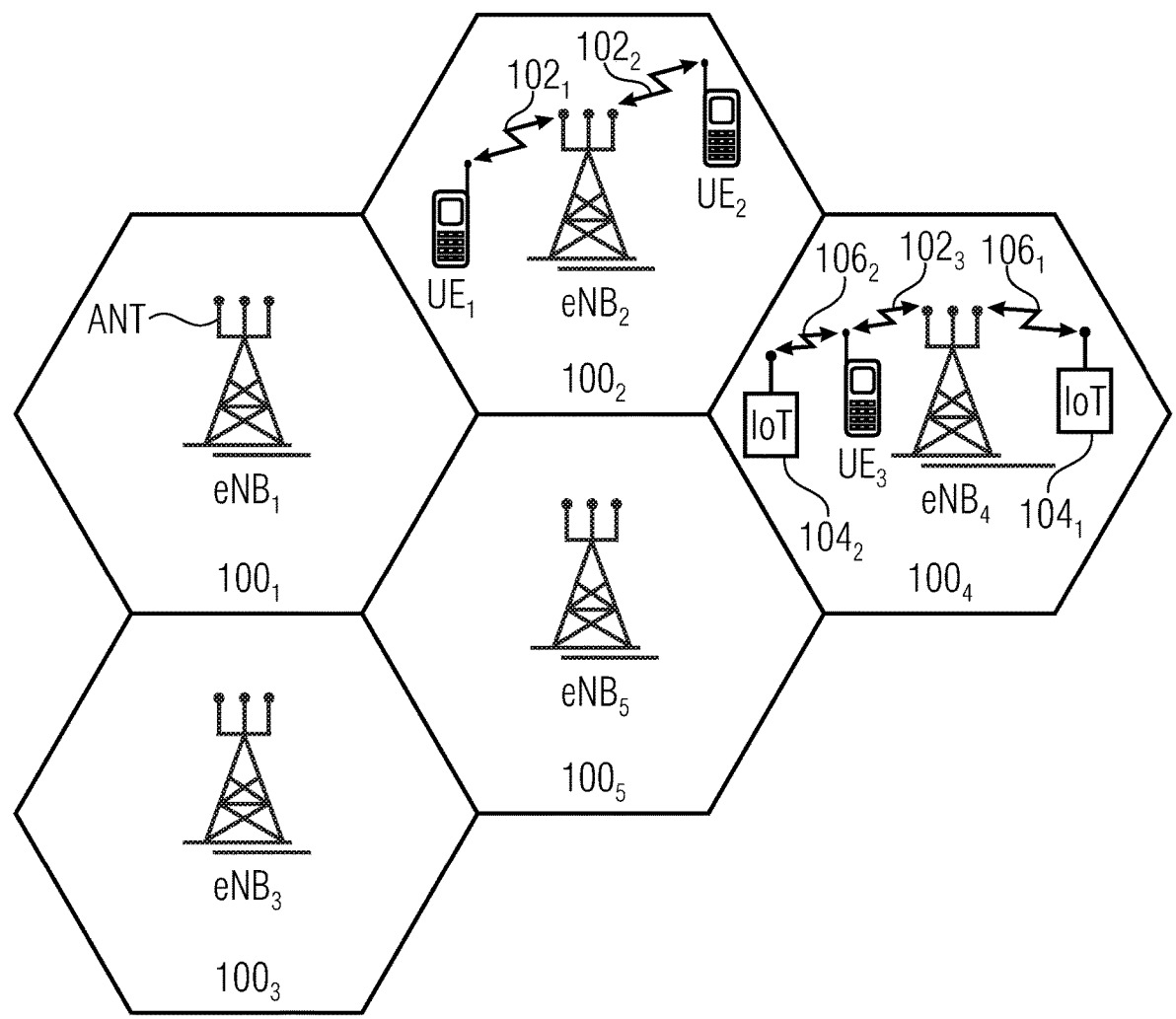
FIG. 1 shows a schematic representation of an example of a wireless communication system.
Figure 2:
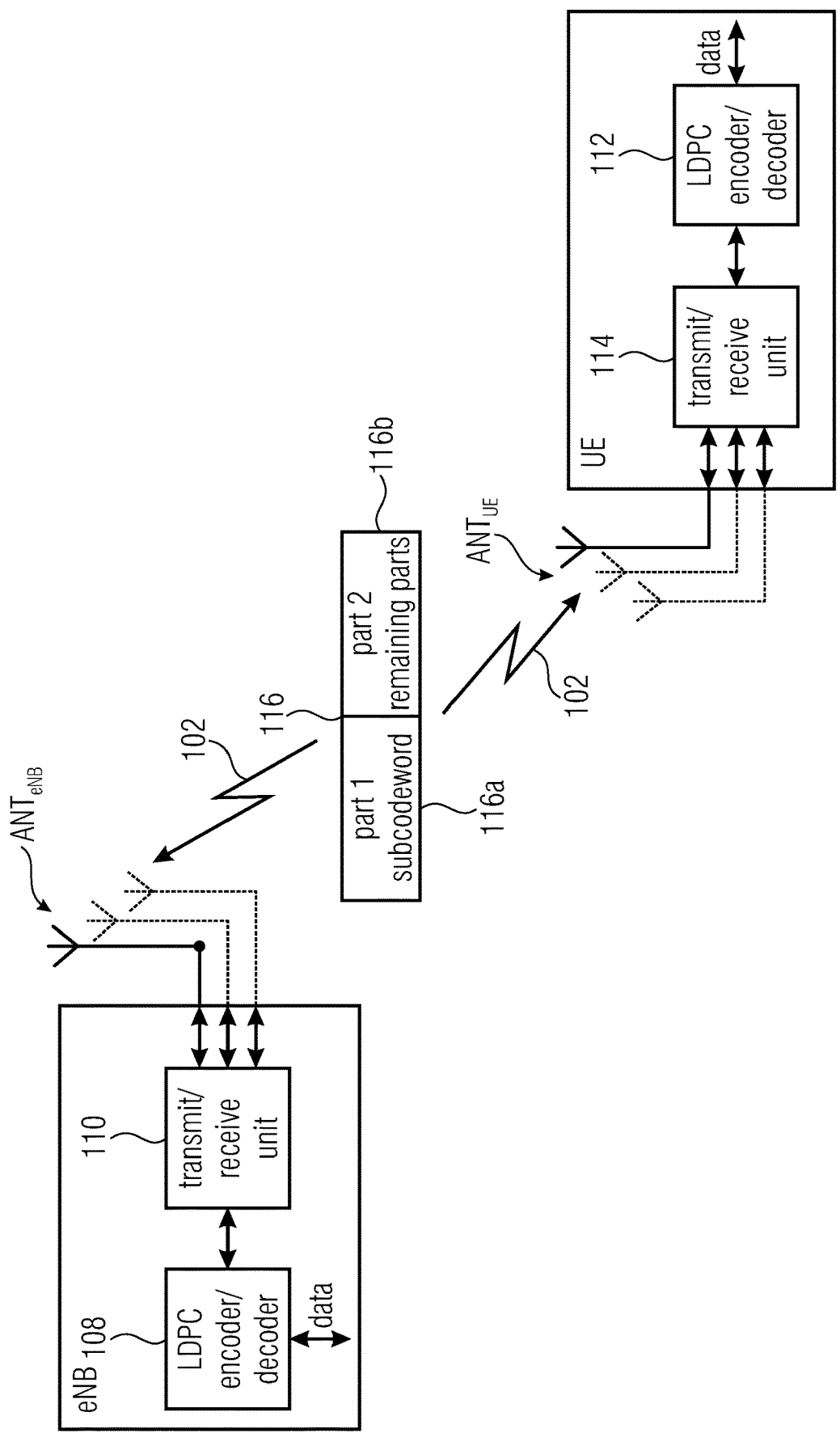
FIG. 2 is a schematic representation of a wireless communication system for transmitting information from a transmitter to a receiver.

Embodiments of the present invention may be implemented in a wireless communication system as depicted in FIG. 1 including base stations and UEs, like mobile terminals or IoT devices. FIG. 2 is a schematic representation of a wireless communication system for communicating information between a base station BS and a UE. The base station BS includes one or more antennas $ANT_{BS}$ or an antenna array having a plurality of antenna elements. The UE includes one or more antennas $ANT_{UE}$. As indicated by the arrow 102 signals are communicated between the base station BS and the UE via a wireless communication link, like a radio link. The wireless communication system may operate in accordance with the embodiments described herein.

In accordance with embodiments, for example in case of a downlink data transmission in the wireless communication network, the base station BS includes a low-density parity-check (LDPC) encoder/decoder 108 coupled to a transmit/receive unit 110 which, in turn, is connected to the one or more antennas $ANT_{eNB}$. When the base station operates as a transmitter, the LDPC encoder/decoder 108 receives data to be transmitted to the UE, which operates as a receiver, over the communication link or channel 102. The LDPC encoder/decoder 108 encodes the data using a low-density parity-check (LDPC) code to obtain a codeword. The codeword is defined by a plurality of variable nodes associated with a plurality of the check nodes of a bipartite graph representing the LDPC code. The transmit/receive unit 110 transmits the codeword over the channel 102 to the UE such that selected variable nodes associated with a subset of the check nodes of the bipartite graph are transmitted prior to the remaining variable nodes. The selected variable nodes define a subcodeword known at the UE. The subcodeword is used by the UE to estimate a decodability of the transmitted codeword prior to receiving all variable nodes of the codeword. The UE includes a LDPC encoder/decoder 112 coupled to a transmit/receive unit 114 which, in turn, is connected to the one or more antennas $ANT_{UE}$. When the UE operates as a receiver, the UE receives from the base station eNB, which operates as a transmitter, over the communication link or channel 102 a data signal 116. The LDPC encoder/decoder 112 receives over the via the one or more antennas $ANT_{UE}$ and the transmit/receive unit 114 the data signal 116 to be decoded. The codeword is transmitted over the channel 102 such that the subcodeword is transmitted prior to the remaining variable nodes of the codeword. The LDPC encoder/decoder 112 estimates the decodability of the transmitted codeword using the subcodeword prior to receiving all variable nodes of the codeword.

In accordance with other embodiments, for example in case of an uplink data transmission in the wireless communication network, the UE is the transmitter and the base station eNB is the receiver.

As mentioned above, FIG. 2 schematically represents the data signal 116 transmitted over the channel 102. In accordance with embodiments the data signal 116 includes the data to be transmitted from the transmitter to the receiver over the channel 102. The data is encoded using a LDPC code so as to obtain a codeword. The codeword is defined by the plurality of variable nodes associated with the plurality of check nodes of the bipartite graph representing the LDPC code. The data signal 116 includes a first part 116a including a subcodeword that is known at the receiver. The subcodeword is defined by selected variable nodes associated with a subset of the check nodes of the bipartite graph. The data signal 116 further includes a second part 116b including the remaining parts of the codeword defined by the remaining variable nodes. As is schematically represented in FIG. 2, the first part 116a precedes the second part 116b so that, upon transmitting the data signal 116, the first part 116a is transmitted first, i.e., prior to the second part 116b. In other words, the second part 116b follows the first part so that the estimation at the receiver can be performed prior to receiving the complete codeword or complete data signal 116 representing the codeword.

Although FIG. 2 represents, schematically, a wireless communication network, as mentioned above, the inventive approach may also be applied in the wired communication networks mentioned above.

The inventive approach allows for a decodability estimation prior to receipt of the complete data signal 116, also referred to as data packet or codeword. Thus, at a time at which parts of the codeword are still received, the receiver may already determine whether the currently transmitted codeword may be decoded or not. In case decodability is determined to be not possible, i.e., the received codeword cannot be decoded by the receiver, or in case it is determined that it is unlikely that the received codeword can be decoded, an early retransmission may be triggered to request the codeword to be retransmitted or to request additional redundancy not yet transmitted. This reduces the delay as, other than in conventional approaches, the retransmission may be requested before the current transmission, e.g. the current TTI, is completed, and the transmitter may send the requested additional redundancy during the very next transmission, e.g. during the next TTI. This enhancement of the retransmission process and the associated reduction of delays shall now be discussed in further detail below with reference to specific, non-limiting embodiments.

Figure 3B:
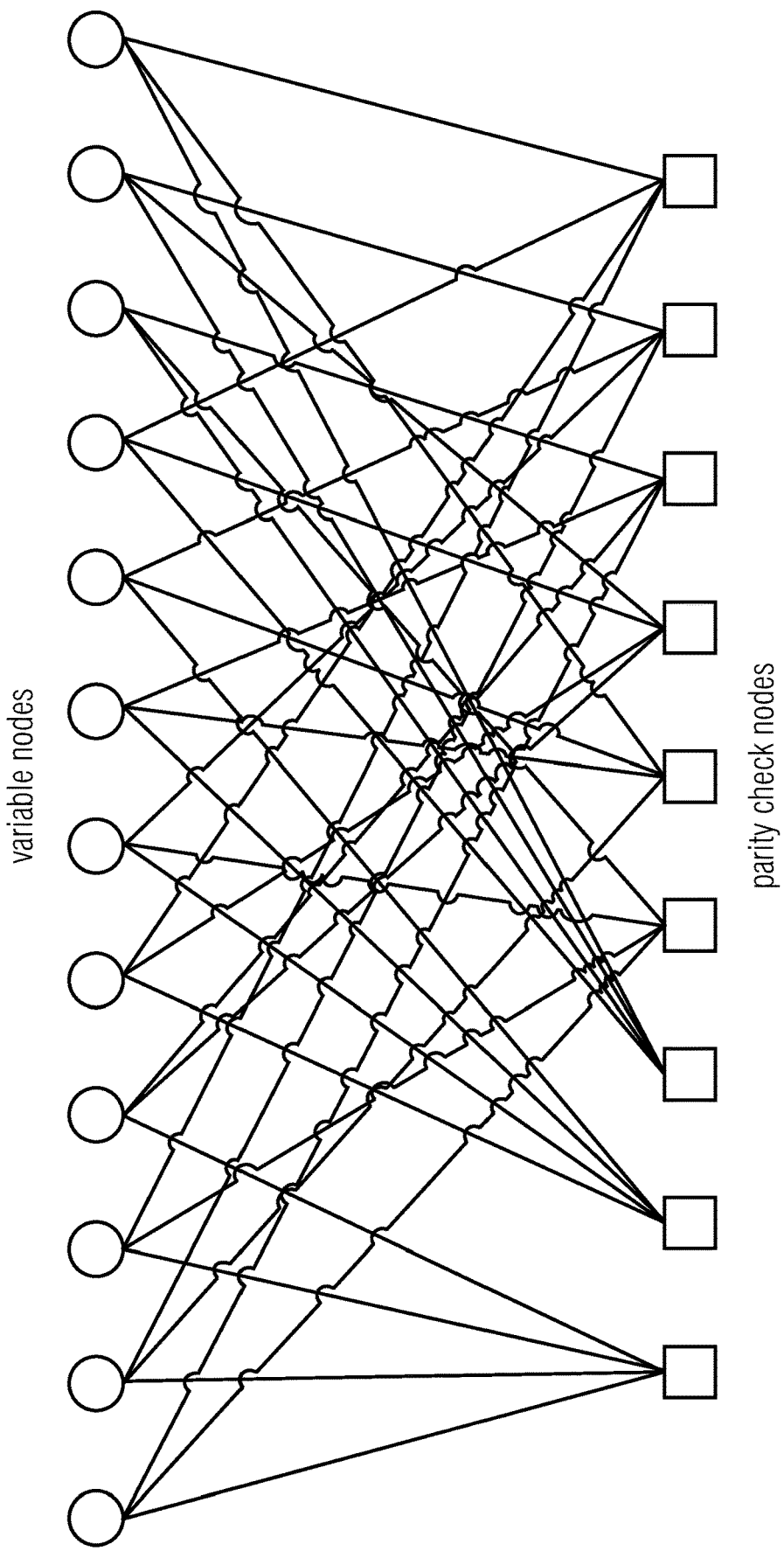
FIG. 3 is a representation of a LDPC code using a matrix representation (see FIG. 3($a$)) and a graphical representation (see FIG. 3($b$))

In accordance with the present invention, data to be transmitted over a channel of a communication network is encoded using low-density parity-check (LDPC) codes which are a class of linear block codes. A LDPC code may be described using a matrix and/or a graphical representation. FIG. 3 is a representation of a LDPC code using a parity-check matrix representation (see FIG. 3(a)) and a graphical representation (see FIG. 3(b)). FIG. 3(a) shows an example of a LDPC matrix H with a dimension n×m for a length 12 (3,4)-regular Gallager parity-check matrix (see for example reference [1]). In general in a low-density parity-check matrix the number of ones in each row and the number of ones in each column is much smaller than n and m, respectively. FIG. 3(b) is a graphical representation for the partity-check matrix H shown in FIG. 3(a) using a bipartite graph, such as the Tanner graph. The Tanner graph includes two types of nodes which are called variable nodes and check or parity-check nodes. The graph includes m check nodes which correspond to the number of parity bits, and n variable nodes which correspond to the overall number of bits in a codeword. A check node i is connected to a variable node j if, and only if, the element $h_{ij}$ of H is a "one". The Tanner graph depicted in FIG. 3(b) is a subclass of bipartite graphs for graphically representing a LDPC code.

In accordance with the inventive approach, the structure of the LDPC codes is exploited to estimate the decodability of an entire codeword before actually all parts of the codeword have been received, which is also referred to as an aggressive predictive HARQ feedback. The advantage is that the latency may be decreased as an HARQ retransmission may be performed earlier. The savings may be due to the early feedback which is returned to the sender or transmitter before the whole or entire codeword is received. Further, savings may be obtained due to the reduced estimation complexity as only a part of the codeword needs to be estimated.

In accordance with the present invention, a codeword "b" to be transmitted over the channel may be calculated on the basis of a vector representing the data bits "a" to be transmitted, and on the basis of a generator matrix G as follows: $b = a \otimes G$, and for "b" it holds that $0 = H \otimes b^T$, wherein $\otimes$ represents a matrix multiplication, for example, using a modulo-2 arithmetic. The generated codeword "b" may be described by the variable nodes and the check nodes using, for example, the Tanner graph. In accordance with the present invention, rather than transmitting the generated codeword "b" over the channel, a subcode or subcodeword is selected from the codeword "b". The subcode or subcodeword is known both at the transmitter and at the receiver, and is constructed from the original codeword "b", also referred to as the mother code.

In accordance with embodiments, a set of check nodes with all associated variable nodes is selected or chosen from the mother code so as to define the subcode. In other words, the subcode is defined by selected variable nodes associated with the set of check nodes, and the subcode may also be a parity-check code. The receiver may estimate the decodability of the subcodeword, for example, by employing a maximum-likelihood (ML) decoder. On the basis of the decodability of the codeword is evaluated. In accordance with other embodiments, to reduce the implementation complexity, other decoders may be used. A belief-propagation based decoder may be used, such as an adjusted min-sum decoder or a sum-product decoder. The above mentioned decoders may determine a variable node reliability (VNR) as described in reference [2] on the basis of which the decodability may be judged.

In accordance with the present invention, the transmitter reorders the variable nodes defining the subcodeword of the known subcode in such a way that the variable nodes which are associated with the chosen check node are transmitted first over the channel, so as to allow for an initial decoding estimation, starting with the nodes associated with the subcodeword which is known at the receiver. Thus, the estimation of the decodability of the codeword currently transmitted may start before the entire codeword has been received. Dependent on the result of the estimate, the receiver may request additional redundancy or may signal to the transmitter that no more redundancy is needed, because it is estimated that the codeword received is decodable or is likely to be decodable. In this case, the transmitter may stop sending redundancy to avoid unnecessary retransmissions and reduce latencies during the data transmission. Instead, the transmitter may already start sending the next codeword, in case a new codeword is to be transmitted. In accordance with further embodiments, the receiver may not send a signal to the transmitter in case it is estimated that the codeword received is decodable or is likely to be decodable. The transmitter may transmit, during the next transmission the redundancy, if explicitly requested by the receiver, otherwise, the transmitter transmits a new codeword, if available. In case no new codeword is available for the receiver during the next transmission and in case no redundancy is requested, the transmitter will not send information for the receiver during the next transmission.

Figure 4:
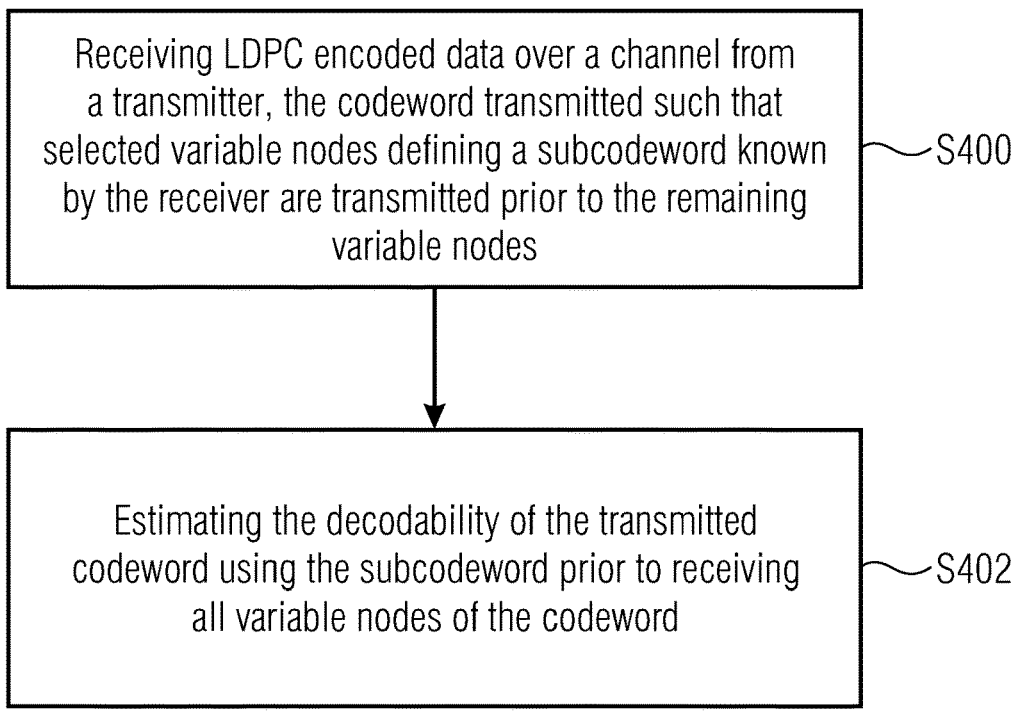
FIG. 4 is a flow diagram of a method for processing received data at a receiver in accordance with an embodiment of the present invention.

FIG. 4 is a flow diagram of a method for processing received data at a receiver in accordance with an embodiment of the present invention. In a first step S400, the receiver receives the LDPC encoded data over the channel from the transmitter. The codeword is transmitted in the above described way such that selected variable nodes defining the subcodeword are transmitted prior to the remaining variable nodes of the codeword. This allows the receiver in step S402 to estimate the decodability of the transmitted codeword using the subcodeword and to evaluate the decodability of the currently transmitted codeword, prior to receiving all variable nodes of the codeword.

Figure 5:
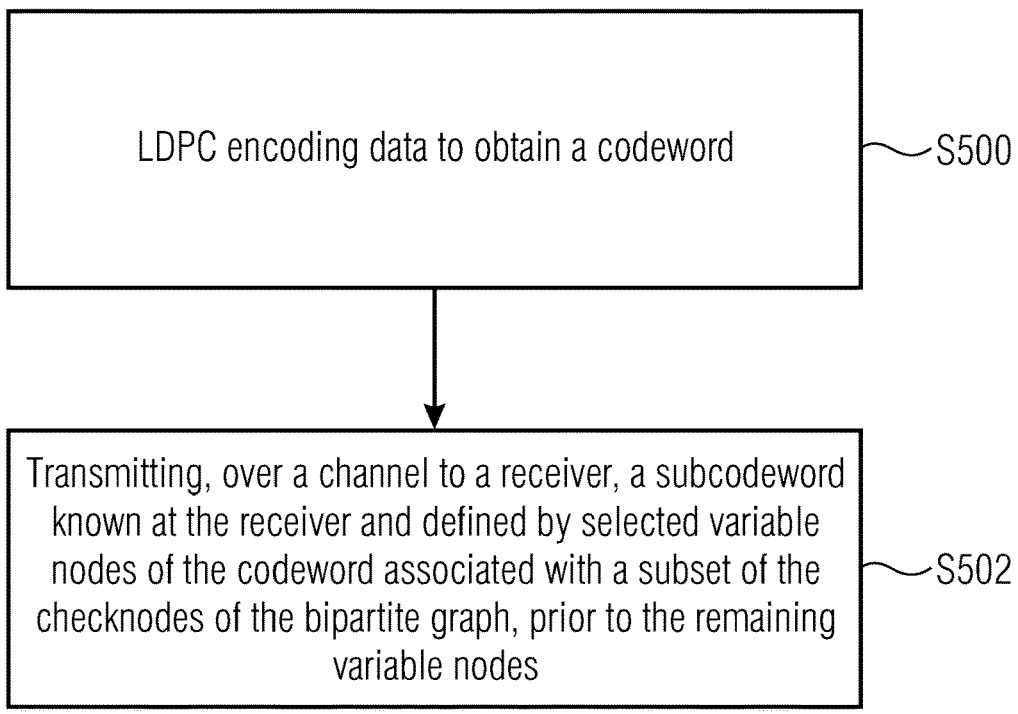
FIG. 5 is a flow diagram representing a method for preparing data to be transmitted by a transmitter in accordance with embodiments of the present invention.

FIG. 5 is a flow diagram representing a method for preparing data to be transmitted by a transmitter in accordance with embodiments of the present invention. The transmitter or sender, after having received data to be transmitted, in a first step S500 performs an LDPC encoding of the data so as to obtain a codeword. On the basis of the codeword, those variable nodes are selected which define a subcodeword which is known at the transmitter and at the receiver and which is used for estimating the decodability of the overall codeword at the receiver. In step S502 the subcodeword is transmitted first, i.e., the selected variable nodes of the codeword defining the subcodeword are transmitted prior to the remaining variable nodes of the codeword. The transmitter provides the information for allowing an early estimation of the decodability of the entire codeword at the receiver.

Figure 6:
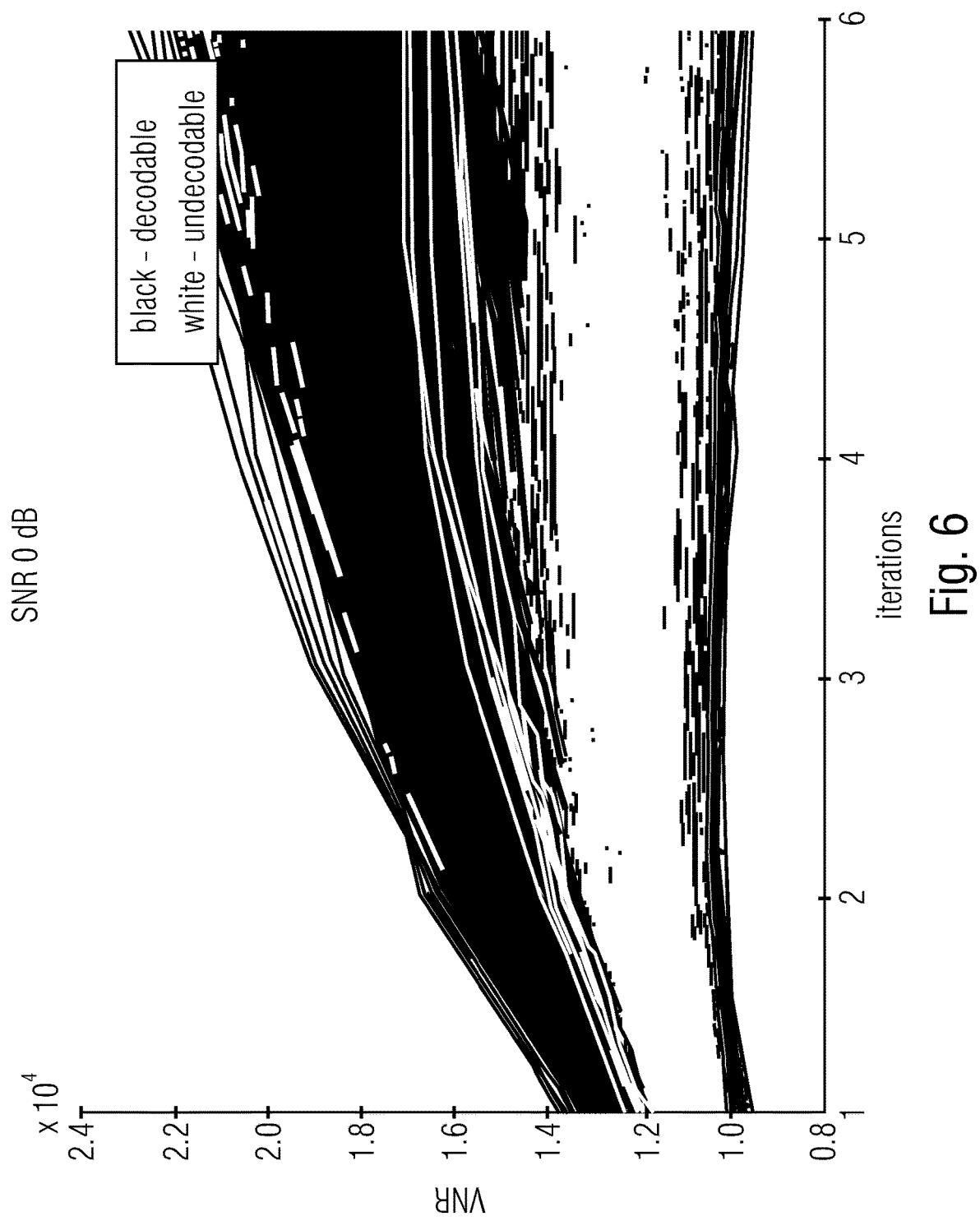
FIG. 6 shows the evolution of the variable node reliability over min-sum iterations, for codewords transmitted over a 0 dB AWGN channel.

In the following an embodiment is described using a code having a codeword with a rate of 1/3 and an incremental redundancy which may be transmitted with a code rate of 1/6. The VNR, as described in reference [3] may be used to evaluate the decodability of the subcode or subcodeword. An offset min-sum algorithm with an offset of 0.26 may be used. FIG. 6 shows the evolution of the VNR over min-sum iterations, and the lines in the graph correspond to one transmitted codeword over a 0 dB AWGN (average additive white Gaussian noise) channel. As may be seen from FIG. 6, there is a correlation between the decodability of the entire codeword and the VNR of the subcodeword. In FIG. 6, a graph is shown having white lines/areas referred to as "undecodable" (the associated VNR values are correlated with a non-decodability of the entire codeword), and black lines/areas referred to, on the other hand, as "decodable" (the associated VNR values are correlated with a decodability of the entire codeword or indicate that the entire codeword may be reliably decoded).

Figure 7:
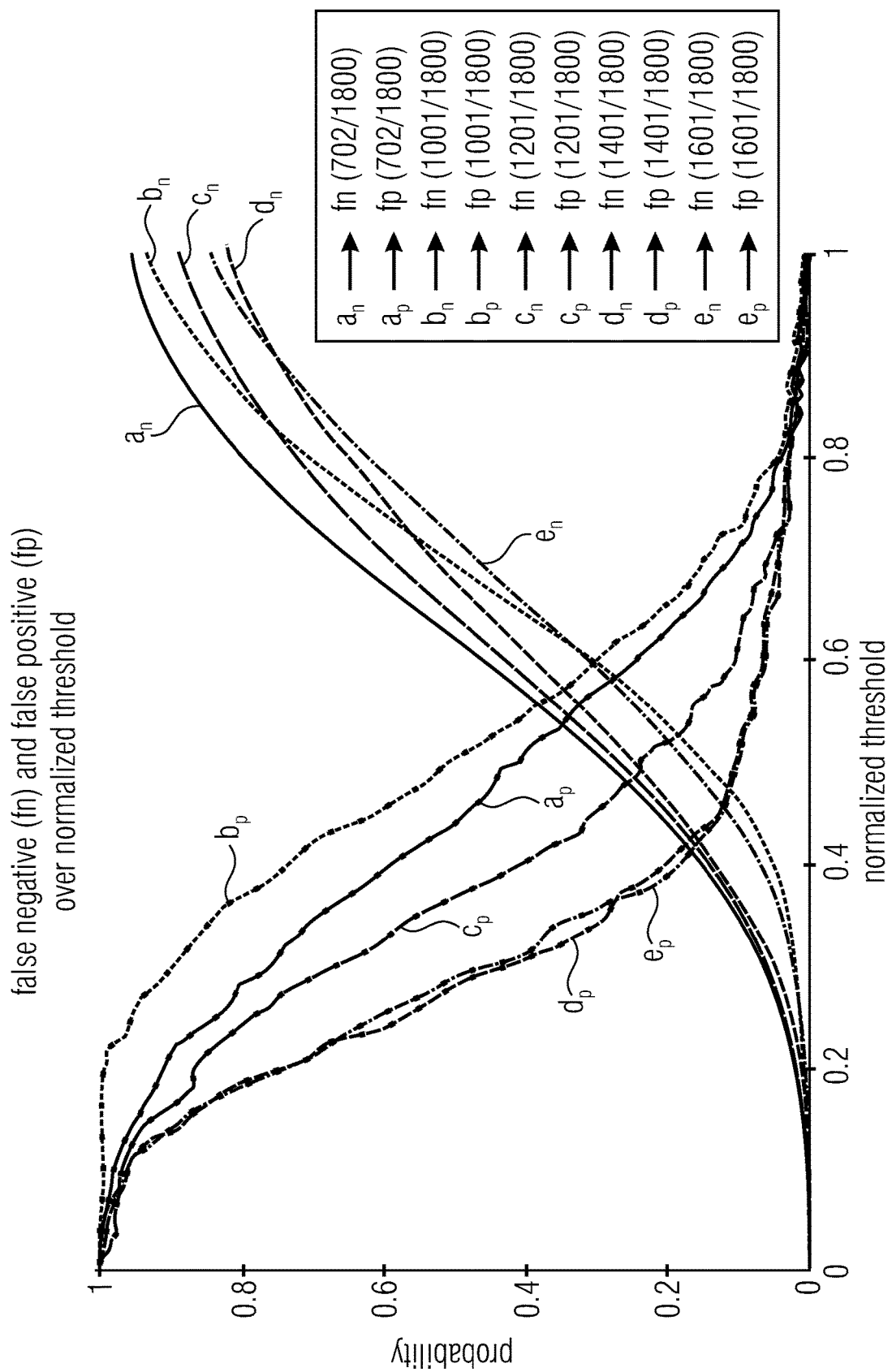
FIG. 7 shows a graph representing false negative and false positive rates over a normalized VNR threshold.

In accordance with embodiments, on the basis of the information in FIG. 6 and dependent on a desired working point, a threshold may be defined to predict the decodability of the entire codeword on the basis of the VNR. The threshold may be selected or set dependent on the false positive rate and the false negative rate obtained from the VNR estimations described above with reference to FIG. 6. The false positive rate indicates that a codeword which has been predicted or estimated to be decodable (so that no retransmission will be triggered), was incorrect because the actual codeword received as a whole is undecodable. The false negative rate indicates that a codeword which has been predicted or estimated to be undecodable (so that a retransmission will be triggered), was incorrect, i.e. after receipt at the receiver the codeword turned out to be decodable. The false positive rate is more critical than the false negative rate as it results in an increase in the delay until additional redundancy for allowing decoding of the entire codeword is received at the receiver. The threshold may be selected as a trade-off between the two measures, namely, between the false positive rate and the false negative rate. FIG. 7 shows a graph representing the false negative and false positive rates over a normalized VNR threshold.

Figure 8:
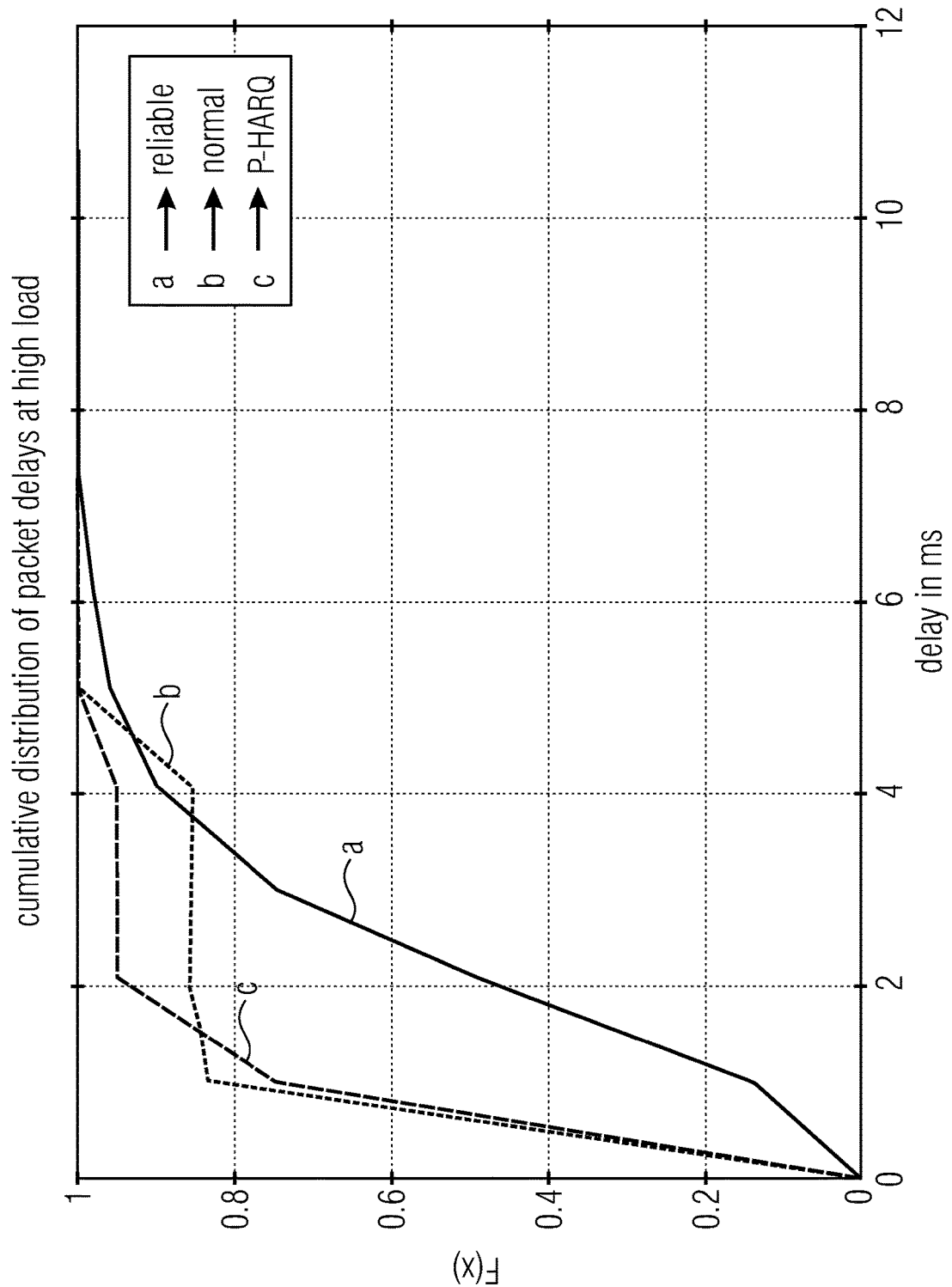
FIG. 8 shows a graph representing the results of system level simulations in high load scenarios.

The inventive approach may be evaluated on a system level. FIG. 8 shows a graph representing the results of system level simulations in high load scenarios. FIG. 8 shows that in the "reliable" scenario (see curve a), the system transmits with a rate of 1/6, thereby blocking two resources. In the "normal" scenario (see curve b), a rate of 1/3 is used, and a conventional HARQ procedure is employed which results in a 4 TTIs (4 ms) RTT. In accordance with the inventive approach (see curve c), also referred to as predictive HARQ or P-HARQ, a rate of 1/3 is used first and the prediction is performed using the subcodeword which is transmitted first. Based on a prediction indicating that the codeword transmitted in the current TTI cannot be decoded, the incremental redundancy is transmitted directly in the next TTI thereby reducing the delay. FIG. 8 shows that the reliable scenario (curve a) suffers from a resource shortage which causes high delays, and that the normal scenario (see curve b) does not provide for a higher throughput within a limited delay, for example, within two milliseconds. However, the inventive approach (see curve c) is advantageous as the incremental redundancy is directly transmitted in the next TTI, rather than waiting for additional TTIs as needed in the normal scheme or even longer as needed in the reliable scheme.

In the embodiments described so far a subcodeword, which is known at the transmitter and at the receiver, is used to allow for an early estimation of the decodability of a codeword currently transmitted to a receiver, for example, on the basis of the VNR as described in reference [3]. In accordance with the inventive approach, this is achieved by transmitting the subcodeword to the receiver first. The known subcodeword is defined using the information elements or bits from the codeword generated on the basis of the data to be transmitted. A plurality of variable nodes associated with a plurality of check nodes of a bipartite graph are selected to define the subcodeword, for example, to select a specific bit pattern representing the subcodeword. Rather than transmitting the codeword as encoded via the channel, in accordance with the inventive approach, those bits or information elements representing the subcodeword are transmitted first so that the receiver may perform the estimation as to whether the entire codeword is decodable or not prior to receiving the complete codeword on the basis of the received subcodeword.

In accordance with further embodiments, the inventive approach may cause the receiver to request, responsive to the estimation indicating that the codeword cannot be decoded, a retransmission, or to signal, responsive to the estimation indicating that the codeword can be decoded, to the transmitter to stop transmitting additional redundancy for the currently transmitted codeword. In other words, dependent on the result of the estimation, it may be determined that in a next transmission no further redundancy about the currently transmitted codeword (current transmission) is needed. The currently transmitted codeword can be fully decoded at the receiver, and, in case there is a new codeword to be transmitted in the next transmission, the new codeword may be transmitted. In case the estimation indicates that the codeword, that is transmitted in the current transmission, is not decodable, in the next transmission, the additional redundancy may be transmitted so that the codeword transmitted in the first transmission may by decoded using the original codeword including information and redundancy from the first transmission and the additional redundancy from the second or re-transmission.

Figure 9:
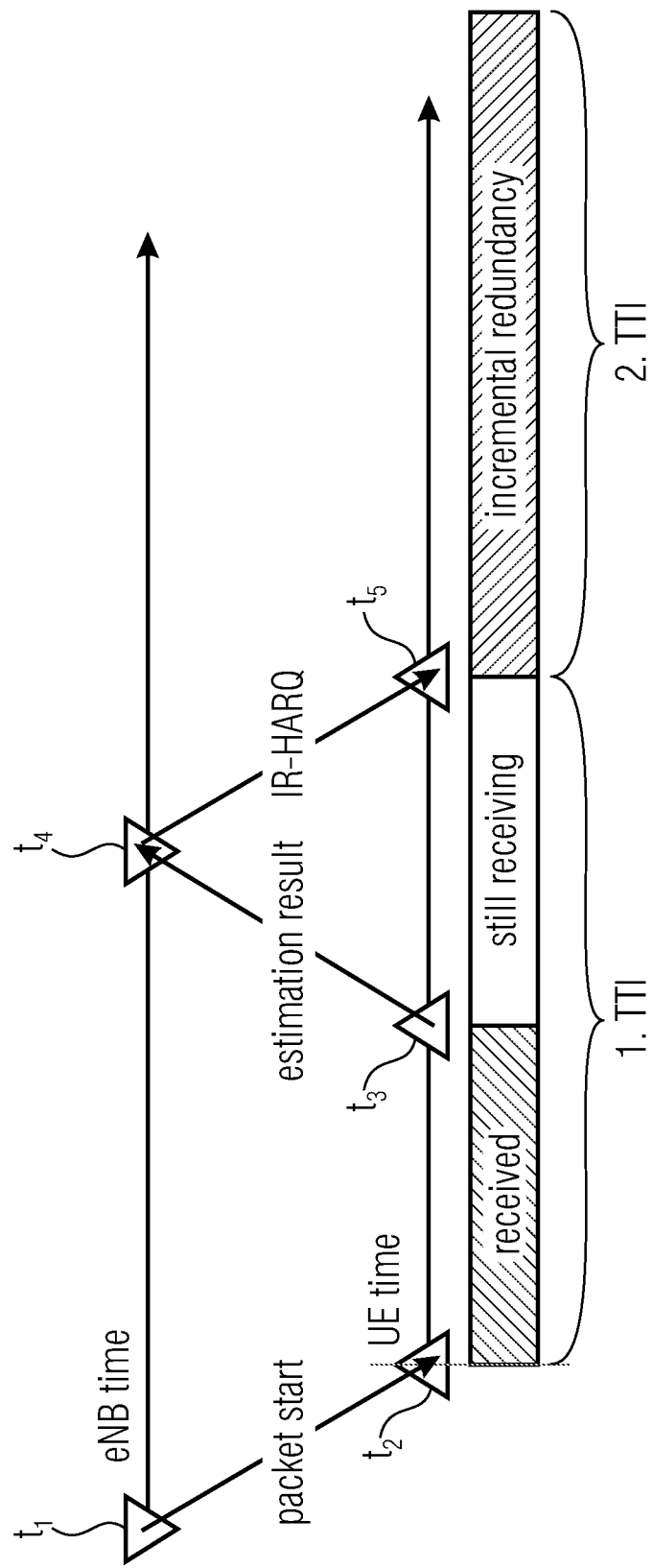
FIG. 9 schematically depicts an embodiment of the predictive HARQ process in accordance with the present invention.

An embodiment of the inventive predictive HARQ process is schematically depicted in FIG. 9. The upper arrow in FIG. 9 shows an eNB time line, and the lower arrow shows a UE time line. At the time $t_1$, the base station transmits the data signal, for example, in the form of a data packet. At the time $t_1$ the transmission of the packet starts. The packet is transmitted over the wireless or wired channel and is received at the receiver at the time $t_2$. The time for receiving the packet completely is the TTI (transmission time interval) having a predefined duration or length. In accordance with the inventive approach, in the packet the subcodeword is transmitted first, and is received at a time $t_3$. The decodability of the transmitted packet is evaluated or estimated on the basis of the subcodeword.

During the estimation the receiver receives the remaining parts of the packet, namely the remaining parts of the codeword not yet transmitted. In FIG. 9 it is assumed that after the time $t_3$ but before the end of the first TTI, the estimation result of the subcodeword is available at the receiver. It is assumed that the estimation indicates that the codeword or packet that is currently transmitted from the base station to the receiver is not decodable. This result is signaled to the base station. At the time $t_4$ which is ahead of the end of the first TTI, the base station sends the additional redundancy for decoding the codeword. At the time $t_5$ which is the end of the first TTI, the additional redundancy is available, and using the data received during the first TTI and buffered at the receiver and the additional redundancy received during the second TTI, the codeword sent by the base station at time $t_1$ can now be decoded at the receiver. The additional redundancy may include chase combining or incremental redundancy.

FIG. 9 shows that the inventive approach accelerates the process for decoding data or packets which, initially, are found to be not decodable at the receiver. In conventional approaches, the request for additional redundancy will start only once the first TTI has been completed, namely at the time $t_5$ and the advantage in terms of reduced delay is readily recognizable from FIG. 9. FIG. 9 shows that the receiver performs the decodability estimation and sends a signal to request further redundancy, in case the estimation shows that the packet currently transmitted cannot be decoded at the receiver on the basis of the information obtained during the first TTI. On the other hand, in case the estimation process yields that the packet can be decoded on the basis of the information received during the first TTI, instead of sending a request signal to the base station at the time $t_4$, the receiver, at the time $t_3$ sends a signal to the base station in the form of a stop signal. The base station, at the time $t_4$, will start sending the next packet which will then be processed in the second TTI in the same way as the first packet received at the time $t_2$ at the receiver.

The codeword received during the first TTI and estimated to be decodable will be decoded by the receiver. For the decoding, the transmitter may signal to the receiver an order of the check nodes defining the codeword so that following the transmission in accordance with the inventive approach the decodable codeword can be reconstructed at the receiver for correct decoding. In case this decoding, despite the estimated decodability, fails (false positive indication), a conventional retransmission process may be triggered to obtain additional redundancy available.

Figure 10:
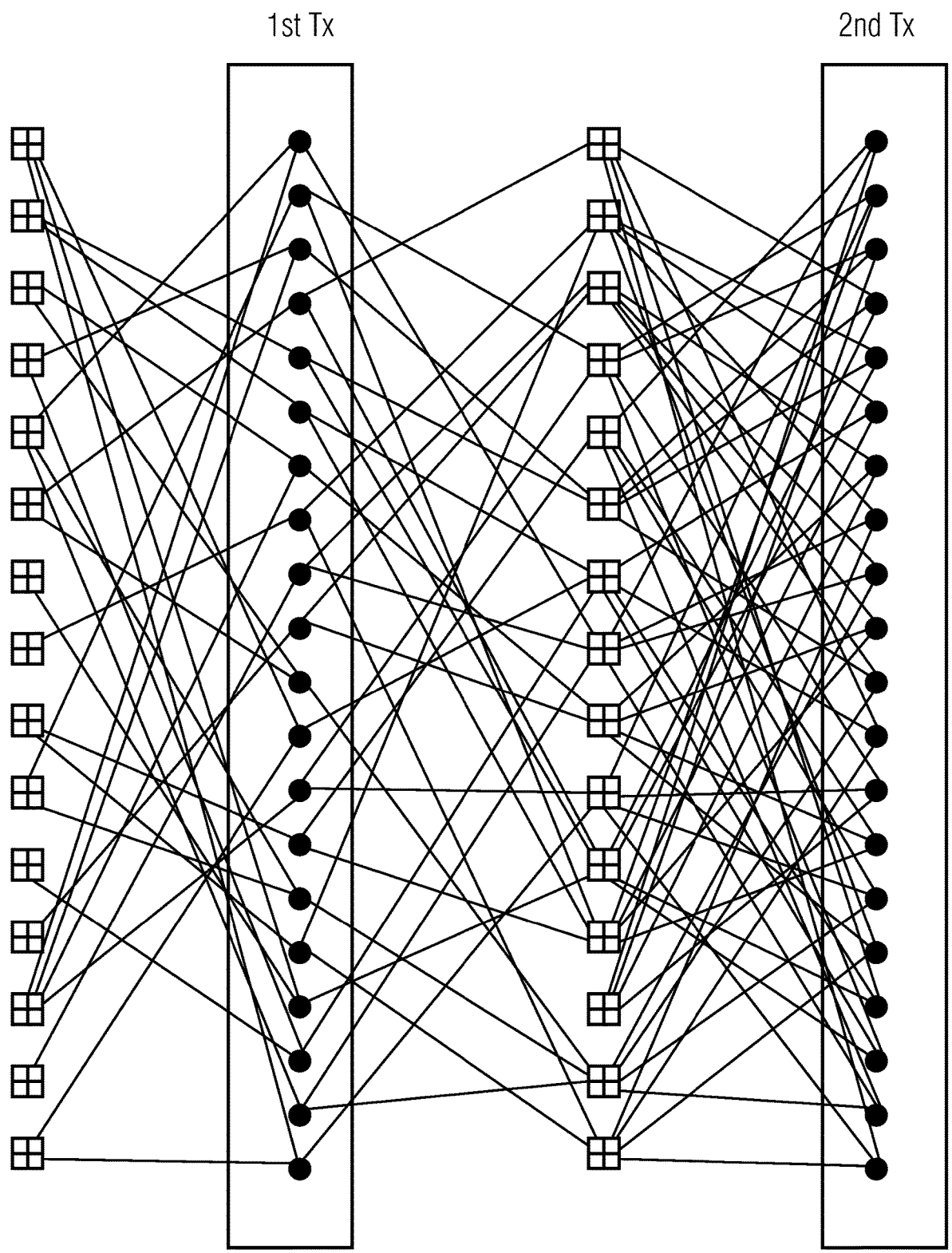
FIG. 10 is a schematic representation of the coupling of two codewords representing first data and second data.

In accordance with further embodiments, the additional redundancy may include new data obtained through coupling. For example, at the time $t_1$ (see FIG. 9), the packet transmitted from the base station towards the receiver may include a codeword representing both first data and redundancy. From the codeword the subcodeword known at the receiver is selected and used for estimating the decodability of the currently transmitted codeword. In case it is determined at the time $t_3$ (see FIG. 9) that the codeword is not decodable, at the time $t_4$ the additional redundancy is sent by the base station, and the additional redundancy includes new data obtained through coupling of LDPC codes, also referred to as spatial coupling (see for example reference [5]). FIG. 10 shows a schematic representation of the coupling of two codewords representing first data and second data as described in reference [5]. At the time $t_4$ the additional redundancy including the new data obtained through coupling is sent. At the transmitter, the redundancy may be selected so that the information bits for the first and second data may be decoded. This is advantageous due to the increased time diversity of the joint codeword.

In accordance with embodiments of the present invention, the decodability may be estimated using information associated with all of the plurality of check nodes of the bipartite graph defining the subcodeword.

In accordance with other embodiments of the present invention, the decodability may be estimated by initially estimating the decodability of the codeword using information associated with a first number of the plurality of check nodes of the bipartite graph defining the subcodeword. In case the estimation indicates that the codeword cannot be decoded, the decodability of the codeword is estimated using information associated with a second number of the plurality of check nodes of the bipartite graph defining the subcodeword. The second number is higher than the first number. In case the estimation still indicates that the codeword cannot be decoded, the estimation of the decodability of the codeword may be repeated using an increasing number of the plurality of check nodes of the bipartite graph defining the subcodeword. Estimating the decodability of the codeword may be repeated until a predefined number of the plurality of check nodes of the bipartite graph defining the subcodeword has been used, and/or until a time is reached to signal the transmitter that additional redundancy is needed or not such that at the beginning of the next transmission interval the additional redundancy or a new codeword is received.

In accordance with yet other embodiments of the present invention, the information associated with some or all of the plurality of check nodes of the bipartite graph defining the subcodeword is transmitted in a fixed or in an arbitrary order.

In accordance with further embodiments, the receiver may perform an evaluation of the estimation, so as to obtain a level of confidence of the estimation result. In addition to the actual estimation result, the additional level of confidence may be taken into consideration when deciding whether the base station is to be requested for additional redundancy in any of the above described ways. For example, the above described VNR thresholds (see FIG. 7) may be used to define such levels of confidence. Based on the confidence, the receiver may perform, for example, a two or more bit predictive-HARQ feedback. According to the confidence level, the transmitter may decide how much redundancy is needed for the HARQ retransmission.

Figure 11:
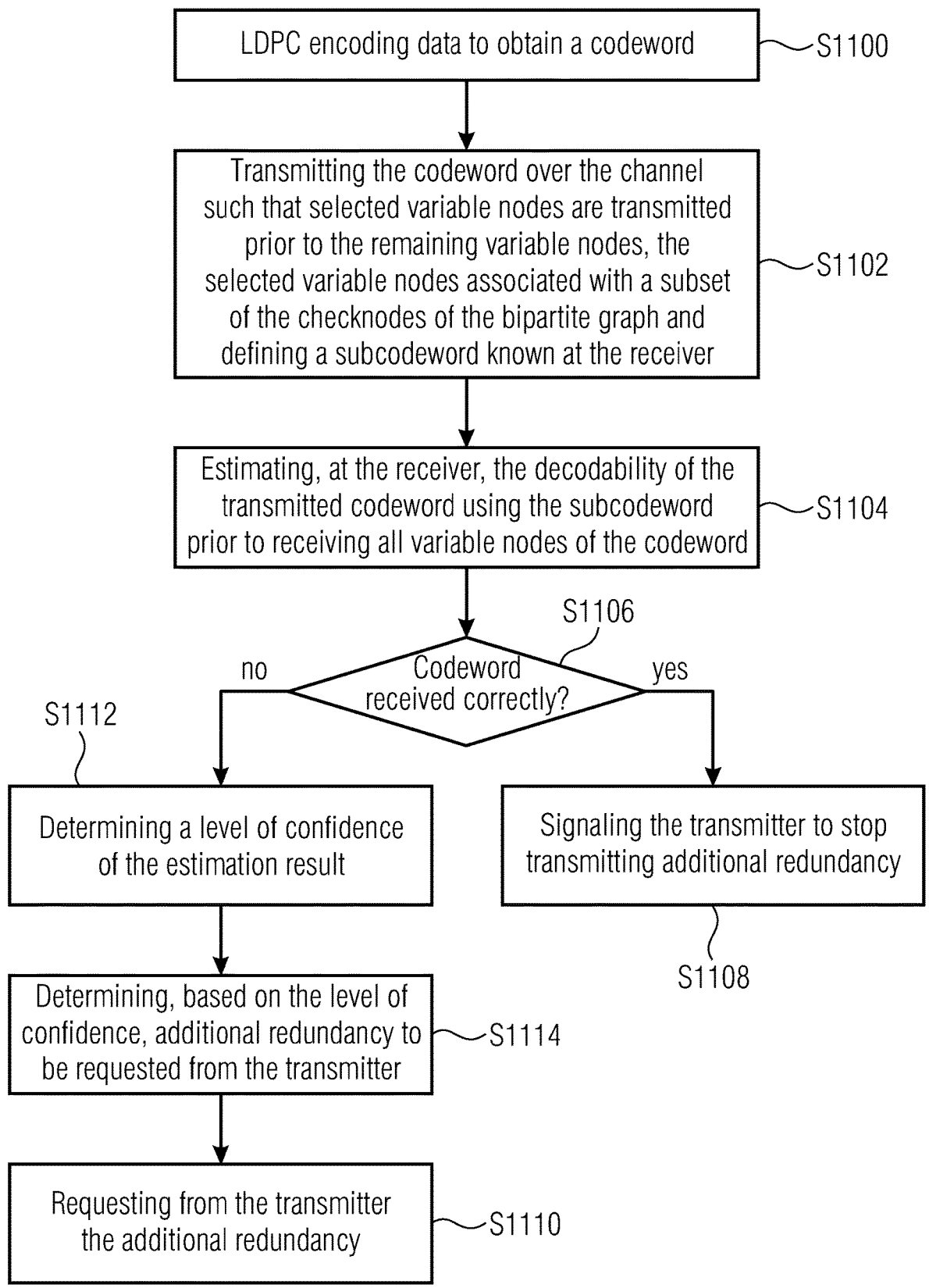
FIG. 11 is a flow diagram of the inventive predictive HARQ process in accordance with an embodiment of the present invention.

FIG. 11 is a flow diagram of the inventive predictive HARQ process in accordance with an embodiment. Data is received at a base station which will be transmitted over the wireless or wired communication network to a user equipment At step S1100 the data is LDPC encoded to obtain a codeword. At step S1102 the codeword is transmitted over the channel. The transmission is such that selected variable nodes are transmitted prior to the remaining variable nodes. The selected variable nodes define a subcodeword that is known at the receiver and that is transmitted as first part of the codeword. A step S1104, the decodability of the codeword received is estimated at the receiver using the subcodeword prior to receiving all variable nodes of the codeword (see FIG. 9). At step S1106, it is determined whether the estimation in step S1104 indicated that the currently transmitted codeword can be decoded. In case this is true, the method, at step S1108 signals to the transmitter that it is not needed to transmit any additional redundancy so that, at the end of the first TTI (see FIG. 9), transmission of the redundancy including the new data obtained through coupling may be started. As mentioned above, in accordance with other embodiments, no signaling to the transmitter is performed when step S1106 indicates that the currently transmitted codeword can be decoded. There is no step S1108 in such an embodiment.

In case it is determined at S1106 that the estimate indicates that the codeword is not decodable at the receiver, the inventive approach, at step S1110 requests from the transmitter additional redundancy. In accordance with further embodiments of the inventive approach, between steps S1106 and S1110 the additional steps S1112 and S1114 may be optionally provided. At S1112 a level of confidence of the estimation result is determined, as discussed above in detail. At step S1114, the redundancy to be requested from the transmitter at the time $t_3$ (see FIG. 9) is determined so that the determined additional redundancy is requested from the transmitter at step S1110. In accordance with embodiments, all of the steps just described with reference to FIG. 11 may be combined, while other embodiments may not include steps S1108, S1112 and/or S1114.

Although the embodiments of the present invention as described above referred to the LDPC code, the present invention is not limited to such a code. Rather, any other code may be used, which is represented by variable nodes associated with a one or more check nodes of a bipartite graph so that a codewords generated using the code is defined by a plurality of the variable nodes associated with a plurality of the check nodes of the bipartite graph. Further, the present invention is not limited to a Tanner graph, rather, other bipartite graphs, like a factor graph, may be used.

In the embodiments described so far, the subcodeword has been described to be defined by selected variable nodes associated with a subset of the check nodes of the bipartite graph. However, the present invention is not limited to such embodiments. In accordance with further embodiments, the code may be generated such that predefined variable nodes associated with a subset of the check nodes of the bipartite graph define the subcodeword, for example one or more consecutive variable nodes starting with a first one of the variable nodes. In accordance with such an embodiment, the first variable nodes of the codeword define the subcodeword.

Further, in the embodiments described so far, the estimation has been described to be performed on the basis of the subcodeword. However, the present invention is not limited to such embodiments. In accordance with further embodiments, the estimation may take into account additional parameters, like the channel quality, the channel estimation, additional CRC symbols, etc.

Further, in the embodiments described so far, the variable nodes defining the subcodeword are sent prior to the remaining variable nodes. However, the present invention is not limited to such embodiments. In accordance with further embodiments, one or more variable nodes of the codeword, which do not define the subcodeword, may be send ahead of those variable nodes defining the subcodeword. For example, variable nodes of the codeword, which do not define the subcodeword, may be send to such an extent that when sending the subcodeword, the estimation of the decodability at the receiver can be performed such that it can still be signaled to the transmitter that additional redundancy is needed or not and such that at the beginning of the next transmission interval the additional redundancy or, in case there is a new codeword for the receiver, the new codeword is received.

Although some aspects of the described concept have been described in the context of an apparatus, it is clear that these aspects also represent a description of the corresponding method, where a block or a device corresponds to a method step or a feature of a method step. Analogously, aspects described in the context of a method step also represent a description of a corresponding block or item or feature of a corresponding apparatus.

Depending on certain implementation requirements, embodiments of the invention may be implemented in hardware or in software. The implementation may be performed using a digital storage medium, for example cloud storage, a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention may be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier. In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. A further embodiment of the inventive method is, therefore, a data stream or a sequence of signals representing the computer program for performing one of the methods described herein. The data stream or the sequence of signals may for example be configured to be transferred via a data communication connection, for example via the Internet. A further embodiment comprises a processing means, for example a computer, or a programmable logic device, configured to or adapted to perform one of the methods described herein. A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] http://sigpromu.org/sarah/SJohnsonLDPCintro.pdf
[2] 3GPP TS 36.211 V13.1.0
[3] F. Kienle and N. Wehn, "Low complexity stopping criterion for LDPC code decoders," 2005 IEEE 61st Vehicular Technology Conference, 2005, pp. 606-609 Vol. 1.
[4] R1-167271, Nokia, Alcatel-Lucent Shanghai Bell, RAN WG1 #86 Gothenburg, Sweden, Aug. 22-26, 2016
[5] https://simons.berkeley.edu/sites/default/files/docs/2808/slidescostelloshort.pdf

The invention claimed is:

1. A receiver for receiving data in a communication network, comprising
a receive unit configured to receive data over a channel from a transmitter, wherein the data is parity-check enclosed to acquire a codeword, wherein the codeword is defined by a plurality of variable nodes associated with a plurality of the check nodes of a bipartite graph representing code, wherein the codeword is received over the channel such that certain variable nodes of the plurality of variable nodes, which are associated with a subset of the check nodes of the bipartite graph, are received prior to remaining variable nodes of the plurality of variable nodes, and wherein the certain variable nodes define a subcodeword known by the receiver; and
a decoder configured to estimate a decodability of the transmitted codeword using the subcodeword prior to receiving all variable nodes of the codeword,
wherein responsive to an estimation indicating that the codeword cannot be decoded, the receiver is configured to request from the transmitter a retransmission of the data and/or additional redundancy, and
wherein responsive to an estimation indicating that the codeword can be decoded, the receiver is to signal the transmitter to not retransmit the data and/or stop transmitting additional redundancy.

2. The receiver of claim 1, wherein the receiver is configured to determine a level of confidence of the estimation result, and to determine, based on the level of confidence, the additional redundancy to request from the transmitter.

3. The receiver of claim 1, wherein the additional redundancy comprises chase combining, or incremental redundancy, or additional redundancy comprising new data acquired through coupling.

4. The receiver of claim 1, wherein the receiver is configured to estimate the decodability of the codeword using information associated with all of the plurality of check nodes of the bipartite graph defining the subcodeword.

5. The receiver of claim 1,
wherein the receiver is configured to initially estimate the decodability of the codeword using information associated with a first number of the plurality of check nodes of the bipartite graph defining the subcodeword, and
wherein, responsive to an estimation indicating that the codeword cannot be decoded, the receiver is configured to estimate the decodability of the codeword using information associated with a second number of the plurality of check nodes of the bipartite graph defining the subcodeword, the second number being higher than the first number.

6. The receiver of claim 5, wherein, responsive to an estimation indicating that the codeword cannot be decoded, the receiver is configured to repeat estimating the decodability of the codeword using an increasing number of the plurality of check nodes of the bipartite graph defining the subcodeword.

7. The receiver of claim 6, wherein the receiver is configured to repeat estimating the decodability of the codeword until a predefined number of the plurality of check nodes of the bipartite graph defining the subcodeword has been used, and/or until a time is reached to signal the transmitter that additional redundancy is needed or not such that at the beginning of the next transmission interval the additional redundancy or, in case there is a new codeword for the receiver, the new codeword is received.

8. The receiver of claim 1, comprising a Maximum-Likelihood decoder or belief-propagation based decoder to estimate the codeword.

9. A transmitter for transmitting data in a communication network, comprising:
an encoder configured to parity-check encode data to acquire a codeword, wherein the codeword is defined by a plurality of variable nodes associated with a plurality of the check nodes of a bipartite graph representing code; and a transmit unit configured to transmit the codeword over a channel to a receiver such that certain variable nodes of the plurality of variable nodes, which are associated with a subset of the check nodes of the bipartite graph, are transmitted prior to remaining variable nodes of the plurality of variable nodes, wherein the certain variable nodes define a subcodeword known at the receiver and used by the receiver to estimate a decodability of the transmitted codeword prior to receiving all variable nodes of the codeword, and wherein the transmit unit, responsive to a signal from the receiver, is configured to perform a retransmission of the data and/or transmit additional redundancy, or to not perform a retransmission of the data and/or to stop transmitting additional redundancy.

10. The transmitter of claim 9, wherein the signal from the receiver indicates the additional redundancy.

11. The transmitter of claim 9, wherein the additional redundancy comprises chase combining, or incremental redundancy, additional redundancy comprising new data acquired through coupling.

12. A communication network for transmitting data, comprising:
a receiver, comprising
a receive unit configured to receive data over a channel from a transmitter, wherein the data is parity-check encoded to acquire a codeword, wherein the codeword is defined by a plurality of variable nodes associated with a plurality of the check nodes of a bipartite graph representing code, wherein the codeword is received over the channel such that certain variable nodes of the plurality of variable nodes, which are associated with a subset of the check nodes of the bipartite graph, are received prior to remaining variable nodes of the plurality of variable nodes, and wherein the certain variable nodes define a subcodeword known by the receiver; and
a decoder configured to estimate a decodability of the transmitted codeword using the subcodeword prior to receiving all variable nodes of the codeword,
wherein, responsive to an estimation indicating that the codeword cannot be decoded, the receiver is configured to request from the transmitter a retransmission of the data and/or additional redundancy, and
wherein, responsive to an estimation indicating that the codeword can be decoded, the receiver is configured to signal the transmitter to not retransmit the data and/or to stop transmitting additional redundancy, and
a transmitter of claim 9.

13. The communication network of claim 12, wherein the communication network comprises a wired communication network, a wireless communication network, a cellular network, a wireless local area network or a wireless sensor system.

14. The communication network of claim 12, wherein the receiver is a mobile terminal, an IoT device or a base station of a wireless communication network, and wherein the transmitter is a mobile terminal, an IoT device or a base station of the wireless communication network.

15. The communication network of claim 14, using an IFFT (Inverse Fast Fourier Transform) based signal, wherein the IFFT based signal comprises OFDM with CP, DFT-s-OFDM with CP, IFFT-based waveforms without CP, f-OFDM, FBMC, GFDM or UFMC.

16. A method for operating a receiver of a communication network, the method comprising
receiving data over a channel from a transmitter, wherein the data is parity-check encoded to acquire a codeword, wherein the codeword is defined by a plurality of variable nodes associated with a plurality of the check nodes of a bipartite graph representing code, wherein the codeword is received over the channel such that certain variable nodes of the plurality of variable nodes, which are associated with a subset of the check nodes of the bipartite graph, are received prior to remaining variable nodes of the plurality of variable nodes, and wherein the certain variable nodes define a subcodeword known by the receiver; and
estimating a decodability of the transmitted codeword using the subcodeword prior to receiving all variable nodes of the codeword,
responsive to an estimation indicating that the codeword cannot be decoded, requesting from the transmitter a retransmission of the data and/or additional redundancy; and
responsive to an estimation indicating that the codeword can be decoded, signaling the transmitter to not retransmit the data and/or to stop transmitting additional redundancy.

17. A method for operating a transmitter of a communication network, the method comprising:
parity-check encoding data to acquire a codeword, wherein the codeword is defined by a plurality of variable nodes associated with a plurality of the check nodes of a bipartite graph representing t-code;
transmitting the codeword over a channel to a receiver such that certain variable nodes of the plurality of variable nodes, which are associated with a subset of the check nodes of the bipartite graph, are transmitted prior to remaining variable nodes of the plurality of variable nodes, wherein the certain variable nodes define a subcodeword known at the receiver and used by the receiver to estimate a decodability of the transmitted codeword prior to receiving all variable nodes of the codeword; and
responsive to a signal from the receiver, retransmitting the data and/or transmitting additional redundancy, or not retransmitting the data and/or stopping transmitting additional redundancy.

18. A method for operating a communication network, the method comprising:
encoding data to be transmitted over a channel from a transmitter to a receiver, wherein the data is parity-check encoded to acquire a codeword, wherein the codeword is defined by a plurality of variable nodes associated with a plurality of the check nodes of a bipartite graph representing code;
transmitting the codeword over the channel such that certain variable nodes of the plurality of variable nodes are transmitted prior to remaining variable nodes of plurality of variable nodes, wherein the certain variable nodes are associated with a subset of the check nodes of the bipartite graph and define a subcodeword known at the receiver;
estimating, at the receiver, a decodability of the transmitted codeword using the subcodeword prior to receiving all variable nodes of the codeword, responsive to an estimation indicating that the codeword cannot be decoded, requesting from the transmitter a retransmission of the data and/or additional redundancy; and responsive to an estimation indicating that the codeword can be decoded, signaling the transmitter to not a retransmit the data and/or to stop transmitting additional redundancy.

19. The method of claim 18, comprising determining a level of confidence of the estimation result, and determining, based on the level of confidence, the additional redundancy to request from the transmitter.

20. The method of claim 18, wherein the additional redundancy comprises chase combining, or incremental redundancy, or additional redundancy comprising new data acquired through coupling.

21. The method of claim 18, wherein estimating the decodability comprises estimating the decodability of the codeword using information associated with all of the plurality of check nodes of the bipartite graph defining the subcodeword.

22. The method of claim 18, wherein estimating the decodability comprises:
    initially estimating the decodability of the codeword using information associated with a first number of the plurality of check nodes of the bipartite graph defining the subcodeword, and
    responsive to an estimation indicating that the codeword cannot be decoded, estimating the decodability of the codeword using information associated with a second number of the plurality of check nodes of the bipartite graph defining the subcodeword, the second number being higher than the first number.

23. The method of claim 22, comprising, responsive to an estimation indicating that the codeword cannot be decoded, repeating estimating the decodability of the codeword using an increasing number of the plurality of check nodes of the bipartite graph defining the subcodeword.

24. The method of claim 23, wherein estimating the decodability of the codeword is repeated until a predefined number of the plurality of check nodes of the bipartite graph defining the subcodeword has been used, and/or until a time is reached to signal the transmitter that additional redundancy is needed or not such that at the beginning of the next transmission interval the additional redundancy or, in case there is a new codeword to be transmitted at the receiver, the new codeword is received.

25. The method of claim 22, wherein the information associated with some or all of the plurality of check nodes of the bipartite graph defining the subcodeword is transmitted in a fixed or in an arbitrary order.

26. The method of claim 22, comprising employing a Maximum-Likelihood decoder or a belief-propagation based decoder to estimate the codeword.

27. The method of claim 18, wherein the code is a low-density parity-check (LDPC) code.

28. The method of claim 18, wherein the certain variable nodes associated with a subset of the check nodes of the bipartite graph code, which define the subcodeword, are freely selectable from all of the variable nodes or are predefined variable nodes of all of the variable nodes.

29. A non-transitory digital storage medium having a computer program stored thereon to perform a method for operating a receiver of a communication network, the method comprising:
    receiving data over a channel from a transmitter, wherein the data is parity-check encoded to acquire a codeword, wherein the codeword is defined by a plurality of variable nodes associated with a plurality of the check nodes of a bipartite graph representing the code, wherein the codeword is received over the channel such that certain variable nodes of the plurality of variable nodes, which are associated with a subset of the check nodes of the bipartite graph, are received prior to remaining variable nodes of the plurality of variable nodes, and wherein the certain variable nodes define a subcodeword known by the receiver;
    estimating a decodability of the transmitted codeword using the subcodeword prior to receiving all variable nodes of the codeword;
    responsive to an estimation indicating that the codeword cannot be decoded, requesting from the transmitter a retransmission of the data and/or additional redundancy; and
    responsive to an estimation indicating that the codeword can be decoded, signaling the transmitter to not retransmit the data and/or to stop transmitting additional redundancy,
    when said computer program is run by a computer.

30. A non-transitory digital storage medium having a computer program stored thereon to perform a method for operating a tranSmitter of a communication network, the method comprising:
    parity-check encoding data to acquire a codeword, wherein the codeword is defined by a plurality of variable nodes associated with a plurality of the check nodes of a bipartite graph representing code;
    transmitting the codeword over a channel to a receiver such that certain variable nodes of the plurality of variable nodes, which are associated with a subset of the check nodes of the bipartite graph, are transmitted prior to remaining variable nodes of the plurality of variable nodes, wherein the certain variable nodes define a subcodeword known at the receiver and used by the receiver to estimate a decodability of the transmitted codeword prior to receiving all variable nodes of the codeword; and
    responsive to a signal from the receiver, retransmitting the data and/or transmitting additional redundancy, or not retransmitting the data and/or stopping transmitting additional redundancy,
    when said computer program is run by a computer.

31. A non-transitory digital storage medium having a computer program stored thereon to perform a method for operating a communication network, the method comprising:
    encoding data to be transmitted over a channel from a transmitter to a receiver, wherein the data is parity-check encoded to acquire a codeword, wherein the codeword is defined by a plurality of variable nodes associated with a plurality of the check nodes of a bipartite graph representing code;
    transmitting the codeword over the channel such that certain variable nodes of the plurality of variable nodes are transmitted prior to remaining variable nodes of the plurality of variable nodes, wherein the certain variable nodes are associated with a subset of the check nodes of the bipartite graph and define a subcodeword known at the receiver;
    estimating, at the receiver, a decodability of the transmitted codeword using the subcodeword prior to receiving all variable nodes of the codeword;

responsive to an estimation indicating that the codeword cannot be decoded, requesting from the transmitter a retransmission of the data and/or additional redundancy; and responsive to an estimation indicating that the codeword can be decoded, signaling the transmitter to not retransmit the data and/or stop transmitting additional redundancy, when said computer program is run by a computer.

* * * * *

UNITED STATES PATENT AND TRADEMARK OFFICE
CERTIFICATE OF CORRECTION

| | |
|---|---|
| PATENT NO. | : 10,965,401 B2 |
| APPLICATION NO. | : 16/419332 |
| DATED | : March 30, 2021 |
| INVENTOR(S) | : Baris Goektepe et al. |

It is certified that error appears in the above-identified patent and that said Letters Patent is hereby corrected as shown below:

In the Claims

Claim 17, Column 16, Line 34:
"... of a bipartite graph representing t-code;"

Should read as follows:
"... of a bipartite graph representing code;"

Claim 30, Column 18, Line 26:
"... operating a tranSmitter of a communication ..."

Should read as follows:
"... operating a transmitter of a communication ..."

Signed and Sealed this
Thirtieth Day of August, 2022

Katherine Kelly Vidal
*Director of the United States Patent and Trademark Office*